United States Patent [19] — Thompson
[11] 3,947,723
[45] Mar. 30, 1976

[54] LOW POWER HIGH FREQUENCY HORIZONTAL DEFLECTION AMPLIFIER

[75] Inventor: James P. Thompson, San Jose, Calif.

[73] Assignee: Lockheed Missiles & Space Company, Inc., Sunnyvale, Calif.

[22] Filed: Mar. 25, 1974

[21] Appl. No.: 454,686

[52] U.S. Cl. ............................... 315/389; 315/408
[51] Int. Cl.² ............................................ H01J 29/70
[58] Field of Search ................... 315/389, 387, 408

[56] References Cited
UNITED STATES PATENTS

| | | | |
|---|---|---|---|
| 3,293,486 | 12/1966 | Nicholson | 315/389 |
| 3,404,310 | 10/1968 | Williams | 315/389 |
| 3,426,241 | 2/1969 | Perkins | 315/389 |
| 3,700,958 | 10/1972 | Haferi | 315/389 X |
| 3,767,964 | 10/1973 | Varian | 315/389 |
| 3,784,857 | 1/1974 | Christopher | 315/389 X |

*Primary Examiner*—Maynard R. Wilbur
*Assistant Examiner*—G. E. Montone
*Attorney, Agent, or Firm*—H. Donald Volk; B. G. Corber

[57] ABSTRACT

A closed loop controlled amplifier operable on low power is disclosed. The amplifier utilizes a relatively slow, high voltage transistor that is saturated during the active sweep and cut off during the retrace. A dampening network is included which operates during the active horizontal deflection time. A current feedback is derived from the horizontal deflection yoke to stabilize and control the amplifier.

6 Claims, 2 Drawing Figures

LOW POWER HIGH FREQUENCY HORIZONTAL DEFLECTION AMPLIFIER

BACKGROUND OF THE INVENTION

This invention relates to horizontal deflection amplifiers for cathode ray tubes, and more specifically relates to a horizontal deflection amplifier having utility in producing a high resolution display; i.e., one having a substantially perfect linearity correction.

It is well known that a linear display can straightforwardly be obtained on a spherical shaped cathode ray tube. However, since the advent of so-called "flat-faced" cathode ray tubes, the horizontal and vertical deflection amplifiers must be nonlinear.

Moreover, it has been generally accepted that a high voltage must be applied to the horizontal deflection amplifier in order that the amplifier in turn can supply high voltage signals to the horizontal deflection yoke.

One technique utilized by the prior art was to use class-A amplifiers to produce the deflection current. Although these amplifiers were adequate for a small deflection of currents, they have not found utility with the larger cathode ray tubes because of their low efficiency.

Another technique is to use a high voltage amplifier that has better efficiency than a class-A amplifier. However, this technique requires a large amount of power, most of which is dissipated as heat that can damage other components.

Yet another technique is to use a resonant recovery deflection circuit to correct the output wave form of the amplifier. This technique can produce substantially linear spot deflection on the so called "flat-face" cathode ray tube. However, this technique is complex and requires the application of relatively high voltage. See Electronic Design, Jan. 4, 1973, pages 76–80.

Other techniques are shown in the Hewlett-Packard Company Journal dated Feb. 1968, pp. 2 to 8, tilted "A Precision Solid State Television Picture Monitor" and in the Hewlett-Packard Data Sheets on Raster Display, Model 6947A, dated December, 1970.

SUMMARY OF THE INVENTION

The present invention overcomes these disadvantages by a novel though simple approach. More specifically, the disclosed circuit uses closed loop control of the amplifier which allows the use of a lower input voltage.

DESCRIPTION OF THE DRAWINGS

Various features and advantages of the present invention will become more apparent upon consideration of the following description, taken in connection with the accompanying drawings wherein.

DESCRIPTION OF THE PREFERRED EMBODIMENTS

Figure 1:
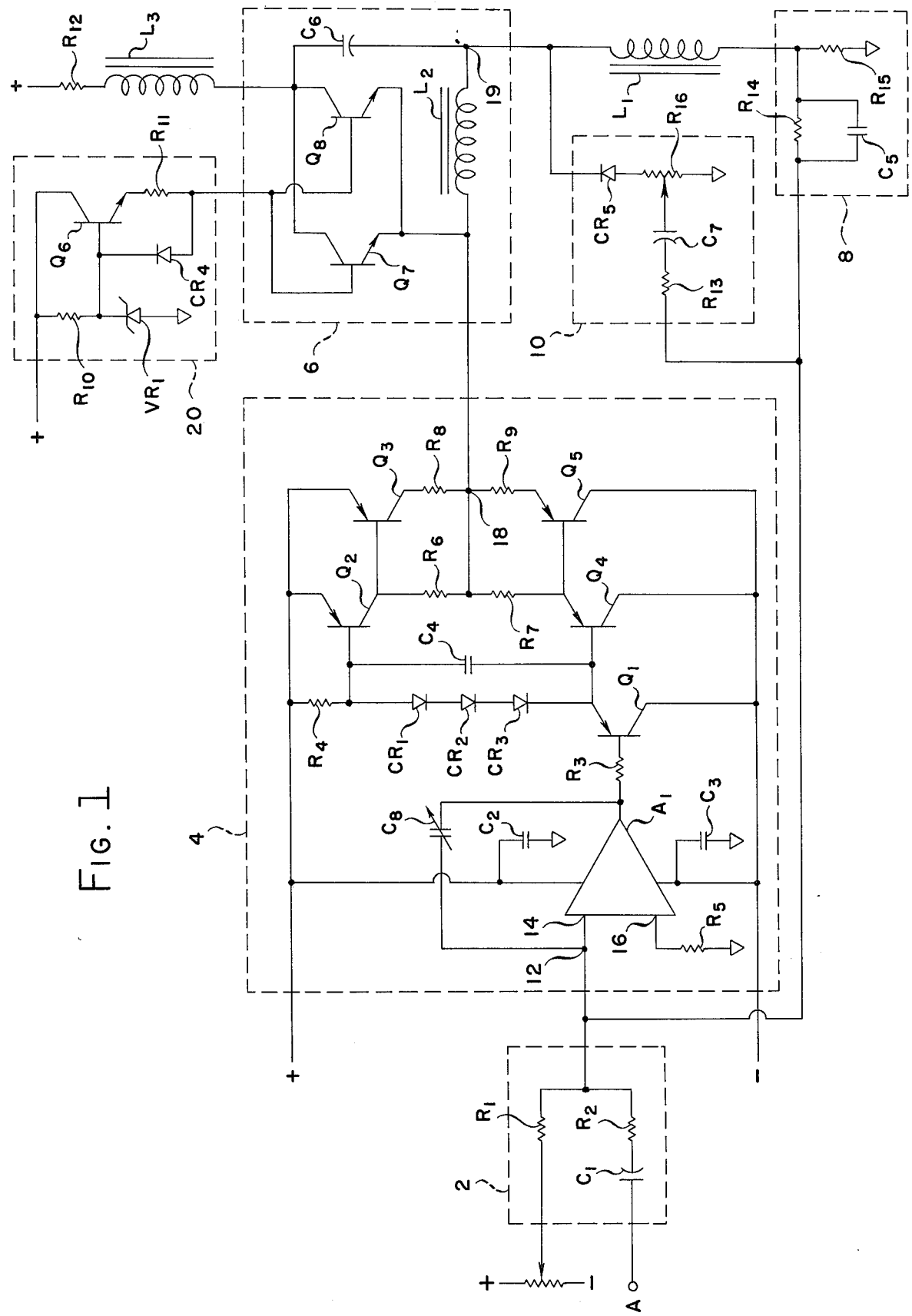
FIG. 1 shows a schematic diagram of the horizontal deflection amplifier in accordance with the invention.

Referring to FIG. 1, the amplifier is designed for driving a horizontal deflection yoke. The circuit includes an input network 2, an amplifier 4, a semiconductor switch 6, a current feedback network 8 and a damping network 10.

The input network 2 conducts current signals from input terminal A to the summing junction 12 of amplifier 4. Resistor R1 conducts a ± D.C. reference to adjust the D.C. bias current in the load. Resistor R2 and a capacitor C1 conduct the deflection signal from the deflection signal generator to the summing junctions of the amplifier. The deflection signal, in the case of a CRT circuit, is the horizontal deflection signal for a television monitor. Any desired correction terms, for example, to correct for geometric distortion in the display tube, can be included in the input signal. If the input signal contains no unwanted D.C. bias voltages, capacitor C1 can be eliminated, and resistor R2 connected directly to the input signal.

The amplifier 4 provides both current and voltage gain to the load in response to the current conducted through the input network, and controlled by the current from the load current feedback network and the damping network. The input signal current is applied to the inverting input 14 of integrated amplifier $A_1$. Integrated amplifier $A_1$ is an integrated circuit, wide band, amplifier which provides high open loop voltage gain such as Model No. NH0024 by National Semiconductor or Model No. HA2520 by Harris Semiconductor. The noninverting input 16 of integrated amplifier $A_1$ is connected to signal ground through resistor R5, providing a D.C. reference for the amplifier.

The +15V and −15V power for the amplifier is filtered by conventional means (not shown). Further filtering is provided by capacitor C2 and capacitor C3 which are connected to the power supply at integrated circuit $A_1$. Capacitor C8 is used to stabilize integrated circuit $A_1$, and is adjusted to prevent oscillation.

The output of integrated circuit $A_1$ is coupled to a unity gain noninverting power stage consisting of transistors Q1, Q2, Q3, Q4 and Q5. The output of the power amplifier is coupled through junction 18 to the semiconductor switch 6.

The semiconductor switch 6 consists of high voltage transistors Q7 and Q8, base bias resistor R11, coupling capacitor C6 and inductor L2. The A.C. component of the output signal is coupled through capacitor C6, while the D.C. bias current is coupled through inductor L2.

The voltage reference 20 consists of a 12 volt zener diode, $VR_1$, resistor R10 and Diode CR4 and transistor Q6. The output of voltage reference 20 is a nominal 11.4 volts, but is not critical as long as transistors Q7 and Q8 can be reverse-biased by the amplifier and the reverse base-emitter voltage rating of Q7 and Q8 is not exceeded. The diode CR4 permits rapid charge removal from the bases of transistors Q7 and Q8.

The inductor L3 provides the stored energy to reverse the load current during the retrace time. The resistor R12 is a necessary part of the circuit, since the current in inductor L3 does not go to zero. The D.C. component of current results in a voltage drop across resistor R12. The voltage applied to resistor R12 can be adjusted for the most optimum level. Too little voltage will not provide enough current through inductor L3 to reverse the load current in load L1 during retrace. Too much voltage will not affect circuit operation, but will result in excessive power loss in resistor R12. The load L1 is any desired inductive element, for example, a deflection yoke for a CRT tube. The inductance of inductance L3 is small compared with the inductance of inductor L2 but large compared with the inductance of load L1.

The current feedback path consists of a sensing resistor, R15, which develops a voltage drop, and resistor R14 which couples the current back to the summing junction 14 of the amplifier. Capacitor C5 provides stability.

The damping network consists of diode CR5, potentiometer R16, capacitor C7 and resistor R13. Only enough damping current is fed back to the summing junction to prevent instability. The diode CR5, blocks the damping feedback voltage during retrace but conducts during the active scan time since the amplifier output is positive during retrace and negative during the active scan time.

OPERATION

Figure 2:
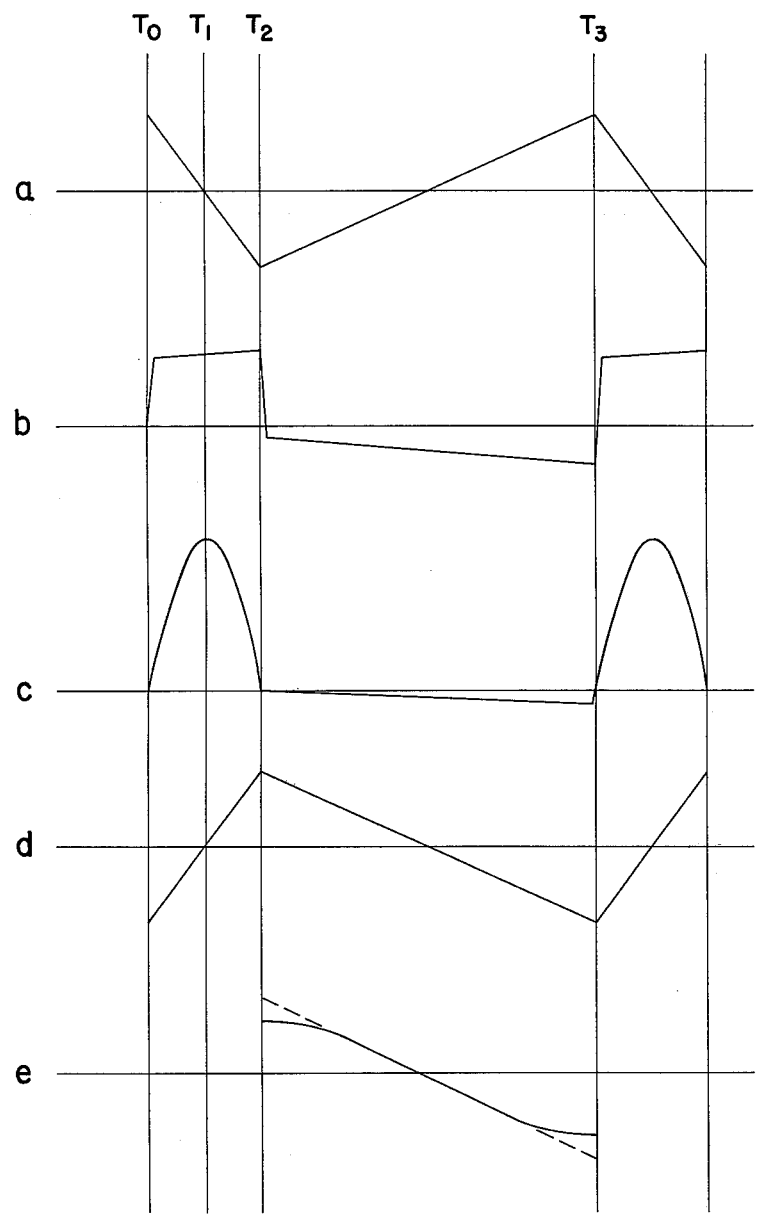
FIG. 2 shows waveform diagrams of electrical signals associated with the circuitry of FIG. 1.

The D.C. term is coupled through the amplifier 4, through inductor L2 and is monitored across resistor R15. The A.C. input term shown in FIG. 2a consists of a long linear ramp (scan time) and a relatively short voltage ramp (retrace time). Since the amplifier is an inverting amplifier, the A.C. term monitored by resistor R15, as shown in FIG. 2d is the inverse of the input term.

At time $T_o$, the input voltage signal from input network 2 to the summing junction 12 of amplifier 4 switches from a positive going ramp to a negative going ramp. This causes the output of amplifier 4 at terminal 18, shown in FIG. 2b, to go positive almost instantaneously to the value determined by the threashold voltage of transistor Q7 and Q5.

Current is conducted to the output terminal 18 of amplifier 4 by two paths. The first path is from the plus terminal through resistor R12, inductor L3, transistor Q7 and transistor Q8 to terminal 18. In the second path, the D.C. component is conducted from the ground terminal through resistor R15, inductor L1 and inductor L2 to terminal 18 of the amplifier while the A.C. component is conducted from the ground terminal through resistor R15, inductor L1, capacitor C6, transistor Q7 and transistor Q8 to terminal 18 of the amplifier.

The output voltage of amplifier 4 continues to rise slowly until it is equal to the constant voltage applied to the bases of transistors Q7 and Q8 minus the internal voltage drop of these transistors. When this occurs, at time $T_1$, transistor Q7 and Q8 are turned off, thus blocking the two current paths to terminal 18 of amplifier 4. This causes inductor L3 to generate an inductive voltage surge of several hundred volts. The load L1 also attempts to generate a voltage surge but this voltage surge is overcome and reversed by the voltage surge of inductor L3 because the inductance of inductor L3 is very large compared to the inductance of load L1. The resulting voltage at terminal 19 is shown in FIG. 2c.

The induced voltage of inductor L3 decays until it reaches zero volts at time $T_2$. Since the amplifier 4 is still attempting to maintain a constant rate of change of current through load L1 and resistor 15, the output of amplifier 4 almost instantaneously goes negative at time $T_2$. The output of amplifier 4 stays negative until time $T_3$ when the cycle is repeated. FIG. 2e shows the resulting voltage load L1 during times $T_2$ to $T_3$ with a linear scan input. The applied voltage slope changes to maintain a constant rate of current change as the inductance of L1 varies during the cycle.

In the foregoing description it will be seen that the present invention provides an improved closed loop horizontal deflection amplifier.

As will be appreciated by those skilled in the art, various modifications, omissions and additions may be used in the present invention without departing from the scope thereof. Accordingly, it is to be understood that the invention shall be limited only by the following claims.

I claim:

1. A control arrangement for controlling the horizontal deflection of a cathode ray display comprising, in combination,
   a controlled amplifier for driving an inductive horizontal deflection yoke means, said amplifier providing both voltage and current amplification,
   switching means with at least one transistor, the emitter of said transistor connected to the output of said controlled amplifier,
   a first circuit network including a first inductor means and a first resistor, said first circuit network connected to a source of positive potential and the collector of said transistor,
   a second circuit network including a first capacitor, said inductive yoke means and a second resistor connected in series, said second circuit network connected to ground and the junction of said first circuit network and the collector of said transistor,
   a feedback network and a damping network, said feedback network and damping network connected between said second circuit network and the input to said controlled amplifier, 2. A control arrangement for controlling the horizontal deflection of a cathode ray display as defined in claim 1 including a second inductor means connected between the emitter of said transistor and the junction of said first capacitor and inductive yoke means in said second circuit network.

3. The control arrangement as set forth in claim 2 wherein said second inductor means has a large inductance relative to said first inductor means, and wherein said first inductor means has a large inductance relative to said inductive yoke means.

4. A control arrangement for controlling the horizontal deflection of a cathode ray display as defined in claim 3 wherein said controlled amplifier includes an integrated circuit amplifier and a unity gain noninverting power stage.

5. The circuit arrangement as set forth in claim 4 wherein said feedback network is further defined as including a third resistor connected in parallel with a second capacitor, said third resistor and said second capacitor connected between the input of said controlled amplifier and the junction of said inductive yoke means and said second resistor.

6. The circuit arrangement as set forth in claim 5 wherein said damping network includes a first diode and a potentiometer connected between ground and the junction of said first capacitor and said inductive yoke means in said second circuit, the arm of said potentiometer connected to the input of said controlled amplifier through a third capacitor and a fourth resistor.

* * * * *

UNITED STATES PATENT OFFICE
CERTIFICATE OF CORRECTION

Patent No. 3,947,723   Dated  March 30, 1976

Inventor(s)  James P. Thompson

It is certified that error appears in the above-identified patent and that said Letters Patent are hereby corrected as shown below:

In the drawings, Figure 1, transistors $Q_2$ and $Q_3$ should appear as follows:

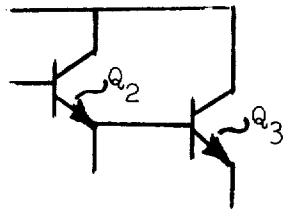

Signed and Sealed this

Twenty-eighth Day of September 1976

[SEAL]

Attest:

RUTH C. MASON
Attesting Officer

C. MARSHALL DANN
Commissioner of Patents and Trademarks